United States Patent
Masuoka et al.

(10) Patent No.: US 6,342,413 B1
(45) Date of Patent: Jan. 29, 2002

(54) METHOD OF MANUFACTURING SEMICONDUCTOR DEVICE

(75) Inventors: Sadaaki Masuoka; Kiyotaka Imai, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/693,909

(22) Filed: Oct. 23, 2000

(30) Foreign Application Priority Data

Oct. 22, 1999 (JP) .......................................... 11-301546

(51) Int. Cl.[7] .................... H01L 21/336; H01L 21/8234
(52) U.S. Cl. ...................................... 438/197; 438/199
(58) Field of Search ................................ 438/197, 199, 438/223, 227, 231, 275, 301, 585, 587, 232, 237, 287

(56) References Cited

U.S. PATENT DOCUMENTS 5,614,432 A * 3/1997 Goto ........................... 438/231
6,033,944 A * 3/2000 Shida ........................... 438/199
6,133,082 A * 10/2000 Masuoka ..................... 438/227
6,191,633 B1 * 2/2001 Fujii et al. .................. 327/313

* cited by examiner

*Primary Examiner*—David Nelms
*Assistant Examiner*—Phuc T. Dang
(74) *Attorney, Agent, or Firm*—McGinn & Gibb, PLLC

(57) ABSTRACT

In a method of manufacturing a semiconductor device having first through third MOS transistors, using a first mask (311), wells (313, 314) and first threshold adjustment regions (315, 316) are formed at transistor areas (306n, 308n) for the second and the third MOS transistors in a semiconductor substrate (301). Next, using a second mask (319), second threshold adjustment regions (320, 321) are formed at transistor areas (304n and 308n) for the first and the third MOS transistors. In the transistor area for the third MOS transistor, both of the first threshold adjustment region and the second threshold adjustment region form a third adjustment region. Thus, using the two masks, three thresholds of the MOS transistors are obtained.

19 Claims, 11 Drawing Sheets

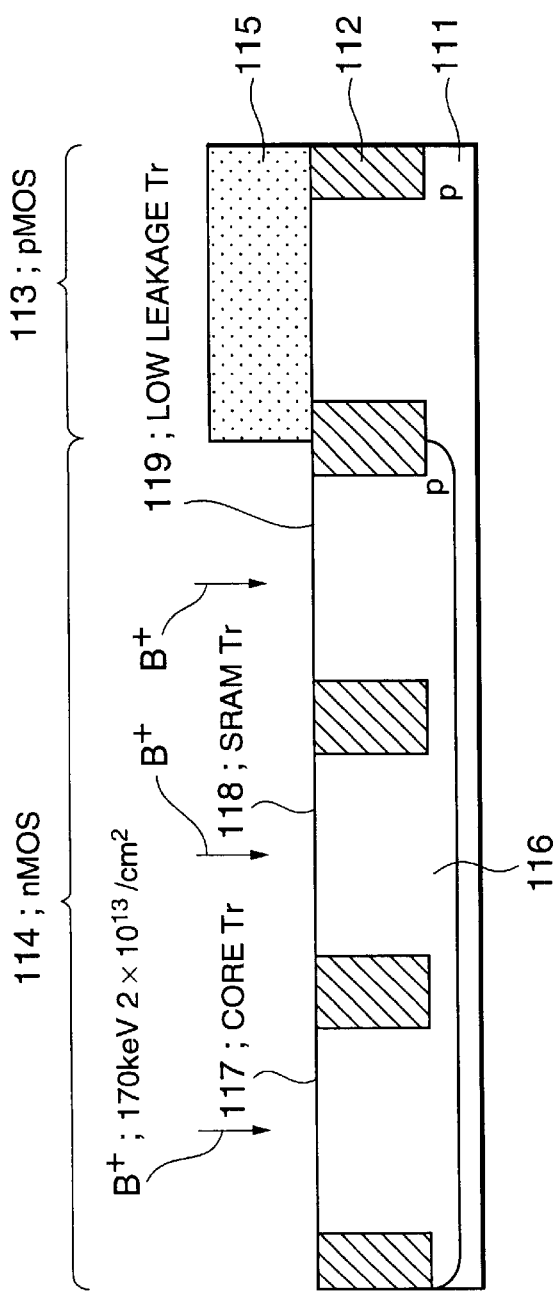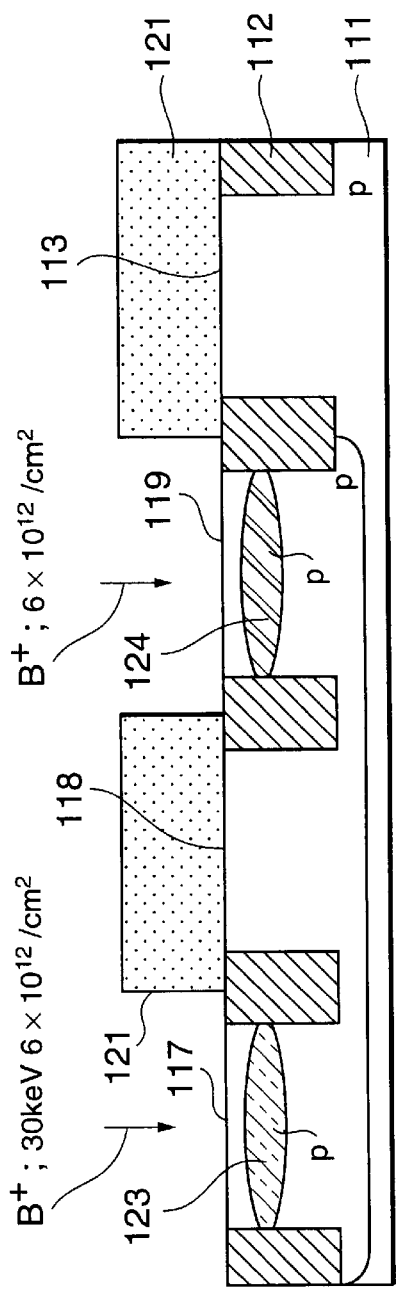
FIG. 2A
FIG. 2B

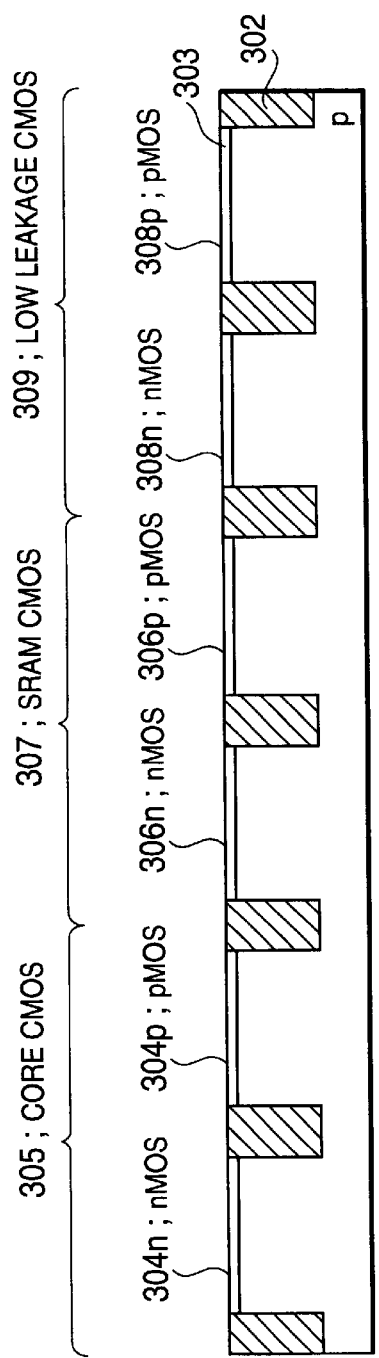
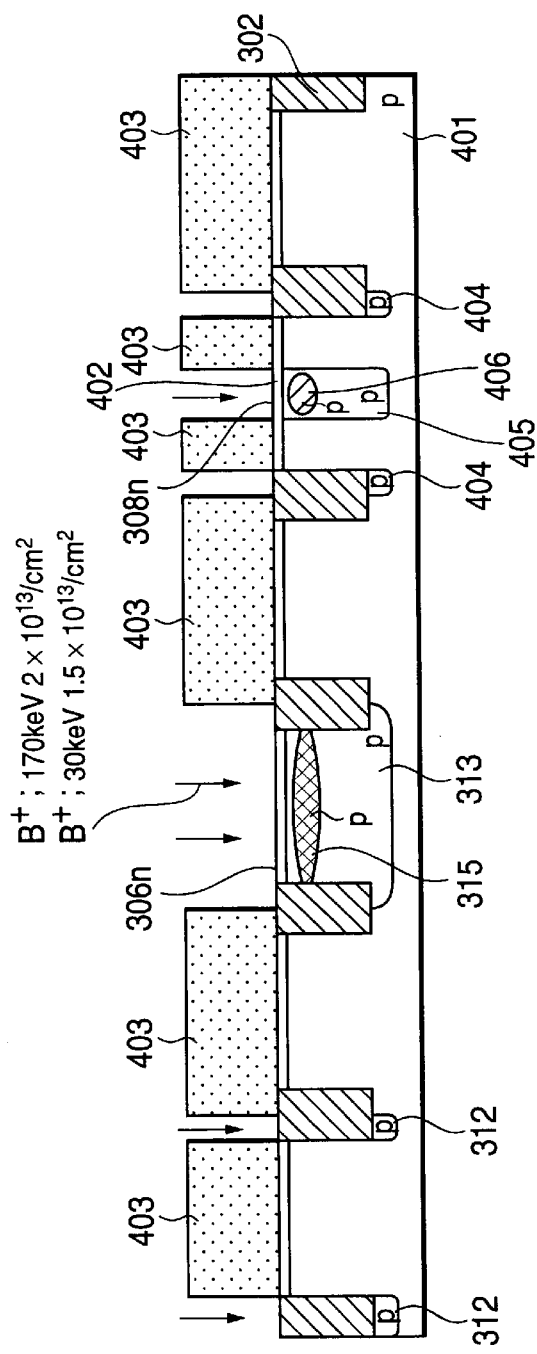
FIG. 4A
FIG. 4B

METHOD OF MANUFACTURING SEMICONDUCTOR DEVICE

BACKGROUND OF THE INVENTION

This invention relates to a method of manufacturing a semiconductor device, and in particular, relates to a method of manufacturing a semiconductor device which has a plurality of MIS (Metal Insulator Semiconductor) transistors having various thresholds.

An LSI (Large Scale Integrated circuit) is known as a typical semiconductor device and generally comprises a large number of MOS (Metal Oxide Semiconductor) transistors which are a sort of the MIS transistors and which are superior in integration. Such an MOS LSI is widely applicable to various electronic equipment including an information equipment because manufacturing costs of the MOS LSI can be lowered by increasing a degree of the integration.

Recently, an LSI that memories and logic units (or logic circuits) are merged in a single semiconductor chip and that is categorized into a group called an SOC (System On Chip) was developed and could realize desired functions singly. For example, the LSI is applied to a mobile information apparatus. The LSI for the mobile information apparatus is designed so as to save power consumption and to be operated by the lowest possible voltage, because a power source is a battery in the mobile information apparatus.

In the LSI categorized into the SOC group, each of the logic units is made by a CMOS (Complementary MOS) process and comprises n-type MOS transistors and p-type MOS transistors. The n-type MOS transistors and the p-type MOS transistors have various thresholds so that the LSI carries out the desired functions.

Generally, reduction of a threshold is necessary to heighten an operation speed of a transistor. Moreover, increase of the threshold is necessary to reduce both of leakage current and power consumption of the transistor. Consequently, the n-type and p-type MOS transistors in each of the logic units have the various thresholds according to their purpose.

If the n-type MOS transistors have three levels for their thresholds in the logic unit, three times of a lithography process are necessary to form a well and channel regions of the n-type MOS transistors. Similarly, if the p-type MOS transistors have three levels for their thresholds in the logic unit, additional three times of the lithography process are necessary to form a well and channel regions of the p-type MOS transistors. Thus, a large number of processes are necessary to manufacture the semiconductor device such as the LSI categorized into the SOC group.

In the meantime each MOS transistor has junction capacitance between each of a source region and a drain region and a substrate. In a case where a rapid operation is desired in the MOS transistor, it is desirable that the junction capacitance is the smallest as possible.

SUMMARY OF THE INVENTION

It is therefor an object of this invention to provide a method of manufacturing a semiconductor device which can be reduce the number of times of lithography process.

It is another object of this invention to provide a structure of a semiconductor device which have MOS transistors having various thresholds and which is easy to manufacture.

It is still another object of this invention to provide a structure of a semiconductor device which has MOS transistors and has small junction capacitance between each of a source region and a drain region and a substrate in at least one of the MOS transistors.

Other object of this invention will become clear as the description proceeds.

According to a first aspect of this invention, a semiconductor device has first, second and third MIS transistors on a semiconductor substrate. The first MIS transistor has a first threshold. The second MIS transistor has a second threshold higher than the first threshold. The third MIS transistor has a third threshold higher than the second threshold. A method of manufacturing the semiconductor device comprises the steps of depositing a first mask on the semiconductor substrate at a first area for the first MIS transistor, introducing first impurities into the semiconductor substrate to form wells at second and third areas for the second and the third MIS transistors, successively, introducing second impurities into the wells to form first threshold adjustment regions for the second threshold, depositing a second mask on the semiconductor substrate at the second area for the second MIS transistor after removing the first mask, and introducing third impurities into the semiconductor substrate to form second threshold adjustment regions for the first threshold at the first and the third areas. One of the second threshold adjustment regions serves as a third threshold adjustment region for the third threshold together with one of the first threshold adjustment regions at the third area.

According to a second aspect of this invention, a semiconductor device has first, second and third MIS transistors in a semiconductor substrate. The first MIS transistor has a first threshold. The second MIS transistor has a second threshold higher than the first threshold. The third MIS transistor has a third threshold higher than the second threshold. A method of manufacturing the semiconductor device comprises the steps of defining first, second and third areas corresponding to the first, the second and the third MIS transistors, respectively, on a surface of the semiconductor substrate, depositing a first mask having first and second opening windows corresponding to the second and the third areas, respectively, on the surface of the semiconductor substrate, introducing first impurities into the semiconductor substrate through said first and the second opening windows to form wells at the second and the third areas at the same time, successively introducing second impurities into the wells through the first and the second opening windows to form first threshold adjustment regions for the second threshold at the same time, completely removing the first mask from the surface of the semiconductor substrate, depositing a second mask having third and fourth opening windows corresponding to the first and third areas, respectively, on the surface of the semiconductor substrate, and introducing third impurities into the semiconductor substrate through the third and the fourth opening windows to form second threshold adjustment regions for the first threshold at the same time. One of the second threshold adjustment regions serves as a third threshold adjustment region for the third threshold together with one of the first threshold adjustment regions at the third area.

According to a third aspect of this invention, a semiconductor device has first, second and third MOS transistors having a first conductive type and has fourth, fifth and sixth MOS transistors having a second conductive type different from the first conductive type. The first and the forth MOS transistors forms a first CMOS transistor having a first threshold. The second and the fifth MOS transistors forms a second CMOS transistor having a second threshold higher than the first threshold. The third and the sixes MOS transistors forms a third CMOS transistor having a third threshold higher than the second threshold. A method of the semiconductor device comprises the steps of defining first through sixth areas corresponding to first through sixth MOS transistors, respectively, on a surface of the semiconductor substrate, depositing a first mask having first and second opening windows corresponding to the second and the third areas, respectively, on the surface of the semiconductor substrate, introducing first impurities of the second conductive type into the semiconductor substrate through the first and the third opening windows to form first wells in the second and the third areas at the same time, successively introducing second impurities of the second conductive type into the first wells through the first and the second opening windows to form first threshold adjustment regions for the second threshold at the same time, completely removing the first mask from the surface of the semiconductor substrate, depositing a second mask having third and fourth opening windows corresponding to the first and the third areas, respectively, on the surface of the semiconductor substrate, introducing third impurities of the second conductive type into the semiconductor substrate through the third and the fourth opening windows to form second threshold adjustment regions for the third threshold at the same time, completely removing the second mask from the surface of the semiconductor substrate, depositing a third mask having fifth and sixth opening windows corresponding to the fourth and the sixth areas, respectively, on the surface of the semiconductor substrate, introducing fourth impurities of the first conductive type into the semiconductor substrate through the fifth and the sixth opening windows to form second wells in the fourth and the sixth areas at the same time, successively introducing fifth impurities of the first conductive type into the second wells through the fifth and the sixth opening windows to form fourth threshold adjustment regions for the first threshold at the same time, completely removing the third mask from the surface of the semiconductor substrate, depositing a fourth mask having seventh and eighth opening windows corresponding to the fifth and sixth areas, respectively, on the surface of the semiconductor substrate, introducing sixth impurities of the first conductive type into the semiconductor substrate through the seventh and the eighth opening windows to form third wells in the fifth and the sixth areas at the same time, and successively introducing seventh impurities of the first conductive type into the semiconductor substrate through the seventh and the eighth opening windows to form fifth threshold adjustment regions for the second threshold in the third wells at the same time. One of the second threshold adjustment regions serves as a third threshold adjustment region for the third threshold together with one of the first threshold adjustment regions at third area. One of the fifth threshold adjustment regions serves as a sixth threshold adjustment region for the third threshold together with one of the fourth threshold adjustment regions at sixth area.

According to a fourth aspect of this invention, a semiconductor device comprises a first MIS transistor having a first source region, a first drain region, a first threshold adjustment region, and a first threshold. A second MIS transistor has a second source region, a second drain region, a second threshold adjustment region, and a second threshold higher than the first threshold. A third MIS transistor has a third source region, a third drain region, a third threshold adjustment region, and a third threshold higher than the second threshold. The first threshold adjustment region is apart from both of the first source region and the first drain region. The second threshold adjustment region is in contact with both of the second source region and the second drain region. The third threshold adjustment region is in contact with both of the third source region and the third drain region.

According to a fifth aspect of this invention, a semiconductor device comprises a first MOS transistor having a first source region, a first drain region, a first threshold adjustment region, and a first conductive type. A second MOS transistor has a second source region, a second drain region, a second threshold adjustment region, and the first conductive type. A third MOS transistor has a third source region, a third drain region, a third threshold adjustment region, and the first conductive type. A fourth MOS transistor has a fourth source region, a fourth drain region, a fourth threshold adjustment region, and a second conductive type, and forms a first CMOS transistor having a first threshold together with the first MOS transistor. A fifth MOS transistor has a fifth source region, a fifth drain region, a fifth threshold adjustment region, and the second conductive type, and forms a second CMOS transistor having a second threshold higher than the first threshold together with the second MOS transistor. A sixth MOS transistor has a sixth source region, a sixth drain region, a sixth threshold adjustment region, and the second conductive type, and forms a third CMOS transistor having a third threshold higher than the second threshold together with the third MOS transistor. The first threshold adjustment region is apart from both of the first source region and the first drain region. The second through the sixth threshold adjustment regions are in contact with the second through the sixth source regions and with the second through the sixth drain regions, respectively.

BRIEF DESCRIPTION OF THE DRAWING

FIGS. 2A through 2D are process drawings for describing a manufacturing process of a conventional semiconductor device;

FIGS. 4A through 4D are process drawings for describing a manufacturing process of a semiconductor device according to a second embodiment of this invention.

DESCRIPTION OF THE PREFERRED EMBODIMENTS

Figure 1:
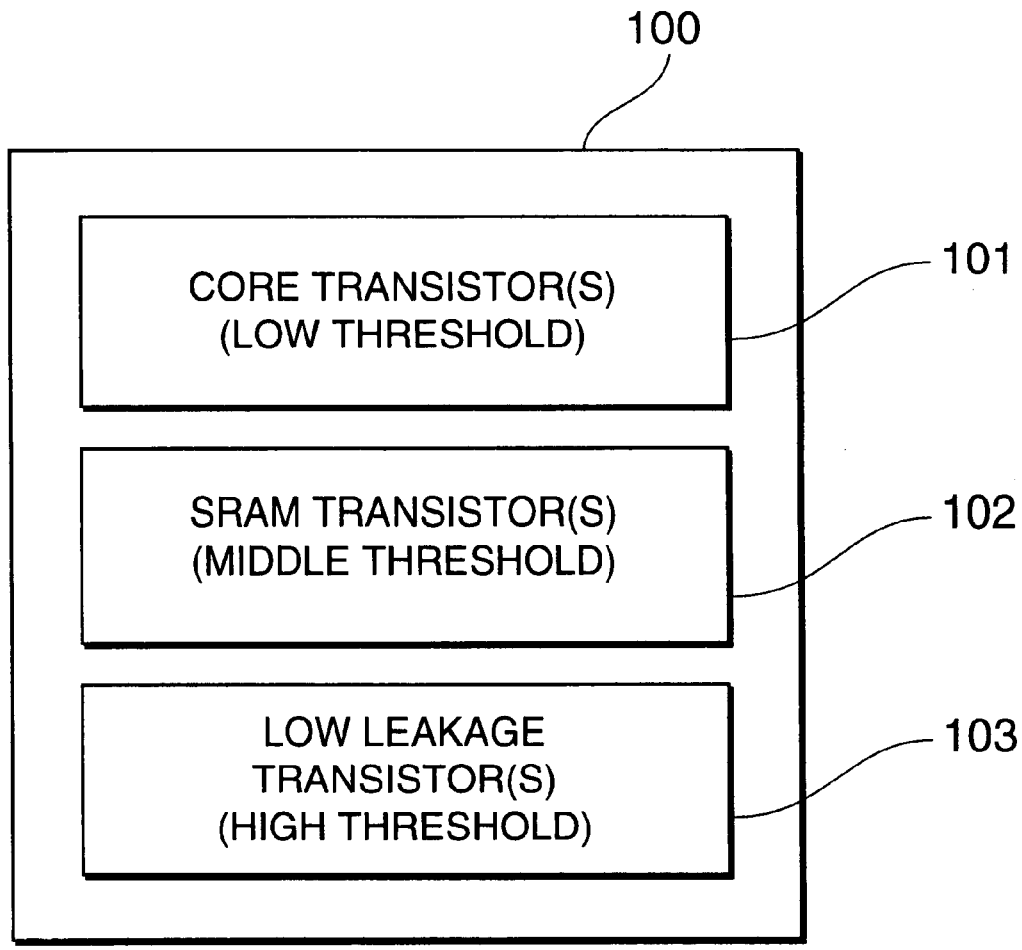
FIG. 1 shows a block diagram of an LSI categorized into a SOC group.

Referring to FIGS. 1 and 2, description will be at first directed to a conventional semiconductor device for a better understanding of this invention.

The conventional semiconductor device is an LSI (Large Scaled Integrated circuit) which comprises a logic unit as a main part and which is categorized into a group called SOC (System On Chip). The logic unit of the mainstream at the present time has MOS transistors that have three levels for their thresholds as shown in FIG. 1.

In FIG. 1, the logic unit 100 comprises a core transistor(s) 101, an SRAM (Static Random Access Memory) transistor (s) 102, and a low leakage (or standby) transistor(s) 103 which are formed on a common semiconductor substrate. The core transistor 101 has a low threshold and is used for a rapid operation such as arithmetic calculation and image processing. The SRAM transistor 102 has a middle threshold and is used for a memory operation. The low leakage transistor 103 has a high threshold and is used for a waiting operation in a sleep state (or a standby state). Hereinbefore, the terms of "low", "middle", and "high" represent comparative values. That is, the terms merely represent that the threshold of the SRAM transistor 102 is larger than that of the core transistor 101 and smaller than that of the low leakage transistor 103. Additionally, the low, the middle, the high thresholds are appropriately designed for a specification of the LSI.

The core transistor 101 needs the low threshold and low junction capacitance Cj between each of its source and drain regions and the semiconductor substrate so as to operate rapidly.

Moreover, the SRAM transistor 102 needs high junction capacitance Cj between each of its source and drain regions and the semiconductor substrate so as to prevent an error.

Furthermore, the low leakage transistor 103 keeps the standby state and needs the high threshold to suppress leakage current. In addition, the small leak transistor 103 needs low junction capacitance Cj between each of its source and drain regions and the semiconductor substrate so as to operates rapidly.

The core transistor 101, the SRAM transistor 102 and the low leakage transistor 103 are supplied with electric power with a voltage of, for example, 1.2–1.5 V from a common power source.

The conventional semiconductor device comprises other MOS transistors for input/output circuit (not shown). The MOS transistors of the input/output circuit are supplied with electric power with a voltage of, for example, 2.5–3.3 V from another power source. Because the MOS transistors of the input/output circuit have no relation with the operation of the logic unit, description about them will be omitted.

The conventional semiconductor device is manufactured as illustrated in FIGS. 2A to 2D. Hereinafter, the description will be mainly made about n-type MOS transistors to simplify it.

At first, as shown in FIG. 2A, a p-type silicon substrate 111 is prepared and element isolating regions 112 are formed in the p-type silicon substrate 111 by the use of well-known STI (Shallow Trench Isolation) technique. The substrate 111 has a p-type MOS transistor area (nMOS) 113 and an n-type MOS transistor area (pMOS) 114.

Next, a first resist film 115 is formed on a surface of the substrate 111 and selectively removed from the n-type MOS transistor area 114 by a first lithography process. The first resist film 115 remains on the p-type MOS transistor area 113.

Then, by using the resist film 115 as a mask for first ion implantation, p-type impurities of boron (B) are ion-implanted into the n-type MOS transistor area 114 on the condition of dose of about $2 \times 10^{13}$ cm$^{-2}$ and acceleration energy of about 170 KeV. Thus, a p-type well 116 is formed at the n-type MOS transistor area 114 and deeper than the element isolating regions 112. The n-type MOS transistor area 114 includes a core transistor area 117, an SRAM transistor area 118 and a low leakage transistor area 119.

Next, as shown in FIG. 2B, a second resist film 121 is formed on the surface of the substrate 111 and selectively removed from both of the core transistor area 117 and the low leakage transistor 119 by a second lithography process. The second resist film 121 remains on the n-type MOS transistor area 113 and the SRAM transistor area 118, respectively. By using the second resist film 121 as a mask for second ion implantation, the p-type impurities are ion-implanted into both of the core transistor area 117 and the low leakage transistor area 119 on the condition of dose of about $6 \times 10^{12}$ cm$^{-2}$ and acceleration energy of about 30 KeV. Thus p-type threshold adjustment impurity regions 123 and 124 are formed in the p-type well 116 at the core transistor area 117 and the low leakage transistor area 119, respectively.

Figure 2C:
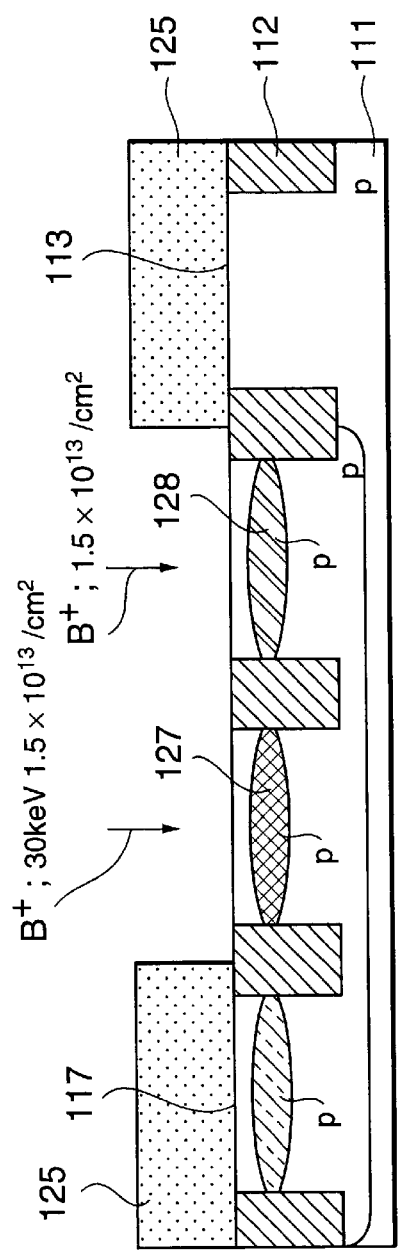

Next, as shown in FIG. 2C, a third resist film 125 is formed on the surface of the substrate 111 and selectively removed from both of the SRAM transistor area 118 and the low leakage transistor area 119 by a third lithography process. The third resist film 125 remains on both of the core transistor area 117 and the p-type MOS transistor area 113. By using the third resist film 125 as a mask for third ion implantation, the p-type impurities are ion-implanted into both of the SRAM transistor area 118 and the low leakage transistor area 119 on the condition of dose of about $1.5 \times 10^{13}$ cm$^{-2}$ and acceleration energy of about 30 KeV. Thus p-type threshold adjustment impurity regions 127 and 128 are formed in the p-type well 116 at the SRAM transistor area 117 and the low leakage transistor area 119, respectively.

Additionally, the p-type threshold adjustment impurity region 124 is changed into the p-type threshold adjustment impurity regions 128 by the third ion implantation.

Figure 2D:
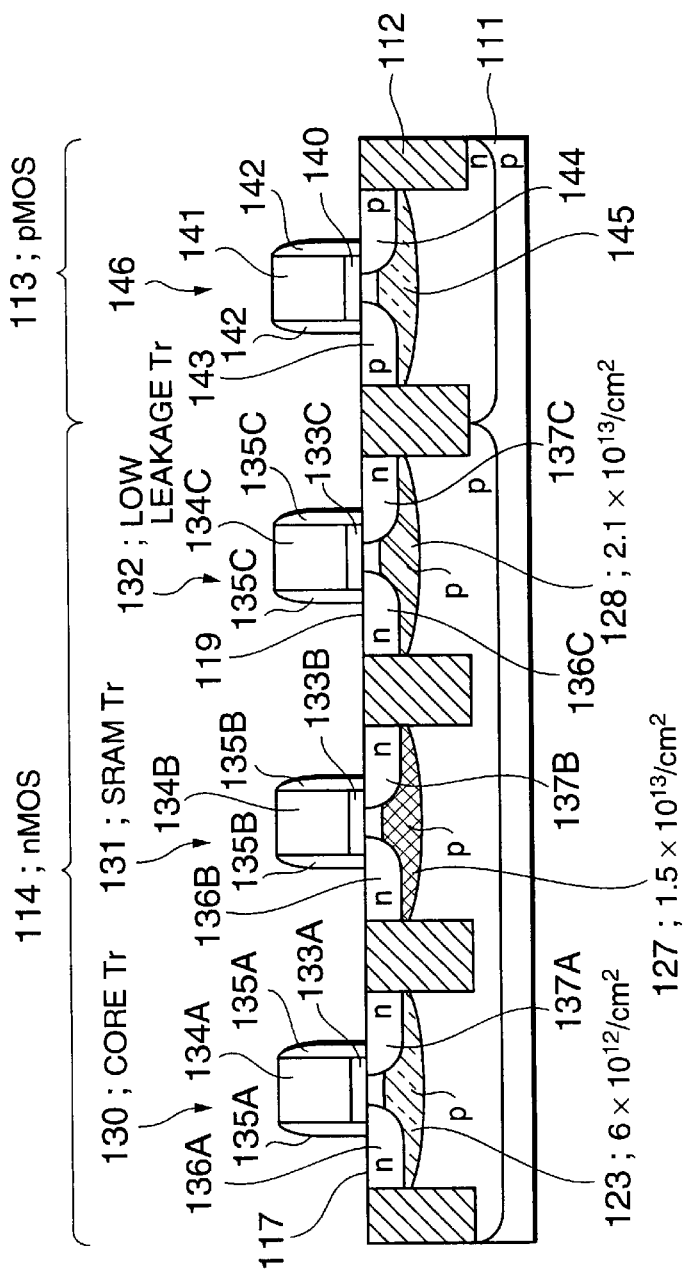

Thereafter, as shown in FIG. 2D, a core transistor 130, an SRAM transistor 131 and a low leakage transistor 132 are formed at the core transistor area 117, the SRAM transistor area 118 and the low leakage transistor area 119, respectively.

Thus the conventional semiconductor device is completed and has n-type MOS transistors having three levels for their thresholds.

In FIG. 2D, the core transistor 130 comprises a gate insulating film 133A formed on the surface of the substrate 111 at the core transistor area 117. A gate electrode 134A is made of polycrystalline silicon and formed on the gate insulating film 133A. Side wall insulating films 135A are formed on side surfaces of both of the gate electrode 134A and the gate insulating film 133A. An n-type source region 136A is formed in the substrate 111 at one side of the gate insulating film 133A while an n-type drain region 137A is formed in the substrate 111 at the other side of the gate insulating film 133A. The core transistor 130 further comprises the p-type threshold adjustment impurity regions 123, which is formed by the first ion implantation of the p-type impurities of a dose of about $6 \times 10^{12}$ cm$^{-2}$, and is the n-type MOS transistor having the low threshold.

Similarly, the SRAM transistor 131 comprises a gate insulating film 133B formed on the surface of the substrate 111 at the SRAM transistor area 118. A gate electrode 134B is made of polycrystalline silicon and formed on the gate insulating film 133B. Side wall insulating films 135B are formed on side surfaces of both of the gate electrode 134B and the gate insulating film 133B. An n-type source region 136B is formed in the substrate 111 at one side of the gate insulating film 133B while an n-type drain region 137B is formed in the substrate 111 at the other side of the gate insulating film 133B. The SRAM transistor 131 further comprises the p-type threshold adjustment impurity regions 127, which is formed by the second ion implantation of the p-type impurity of a dose of about $1.5 \times 10^{13}$ cm$^{-2}$, and is the n-type MOS transistor having the middle threshold.

Furthermore, the low leakage transistor 132 comprises a gate insulating film 133C formed on the surface of the substrate 111 at the low leakage transistor area 119. A gate electrode 134C is made of polycrystalline silicon and formed on the gate insulating film 133C. Side wall insulating films 135C are formed on side surfaces of the gate electrode 134C and the gate insulating film 133C. An n-type source region 136C is formed in the substrate 111 at one side of the gate insulating film 133C while an n-type drain region 137C is formed in the substrate 111 at the other side of the gate insulating film 133C. The low leakage transistor 132 further comprises the p-type threshold adjustment impurity regions 128, which is formed by the first and the third ion implantation of the p-type impurities of doses of about $1.5 \times 10^{13}$ cm$^{-2}$ and about $6 \times 10^{12}$ cm$^{-2}$ (a total of about $2.1 \times 10^{13}$ cm$^{-2}$) and is the n-type MOS transistor having the high threshold.

Though the above-mentioned description does not refer to a manufacturing process of the p-type MOS transistors, a p-type MOS transistor 146 is formed at the p-type MOS transistor area 113 in FIG. 2D. The p-type MOS transistor 146 comprises a gate insulating film 140 formed on the surface of the substrate 111 at the p-type MOS transistor area 113. A gate electrode 141 is made of polycrystalline silicon and formed on the gate insulating film 140. Side wall insulating films 142 are formed on side surfaces of the gate electrode 141 and the gate insulating film 140. An p-type source region 143 is formed in the substrate 111 at one side of the gate insulating film 140 while an p-type drain region 144 is formed in the substrate 111 at the other side of the gate insulating film 140. The p-type MOS transistor further comprises the n-type threshold adjustment impurity regions 145, which is formed by additional ion implantation of n-type impurities of a predetermined doses.

In the above-mentioned manufacturing process, the first through the third resist films 115, 121, and 125 are selectively removed by the first through the third lithography processes, respectively, to be used as the masks for the first through the third ion implantation. That is, the lithography process is carried out at three times for forming the p-type well 116 and the p-type threshold adjustment impurity regions 123, 127, and 128. Therefore, the manufacturing process of the conventional semiconductor device is complicated.

A similar problem arises when the p-type MOS transistors having three thresholds are formed on the semiconductor substrate.

In addition, the core transistor 130 manufactured by the above-mentioned manufacturing process have another problem that it is difficult to reduce the junction capacitance Cj between each of the source and the drain regions 136A and 137A and the semiconductor substrate 111. This is because the source region 136A and the drain region 137A are mostly in contact with the p-type threshold adjustment impurity region 123 having high impurity density in the core transistor 130 as shown in FIG. 2D. In addition, this is because depletion layers between each of the source and the drain regions 136A and 137A and the p-type threshold adjustment impurity region 123 does not widen when the core transistor 130 in an on state.

The p-type MOS transistors formed on the semiconductor substrate have the same problem as the p-type MOS transistors have.

Referring to FIGS. 3A through 3K, the description will proceed to a method of manufacturing a semiconductor device according to a first embodiment of this invention.

Figure 3A:
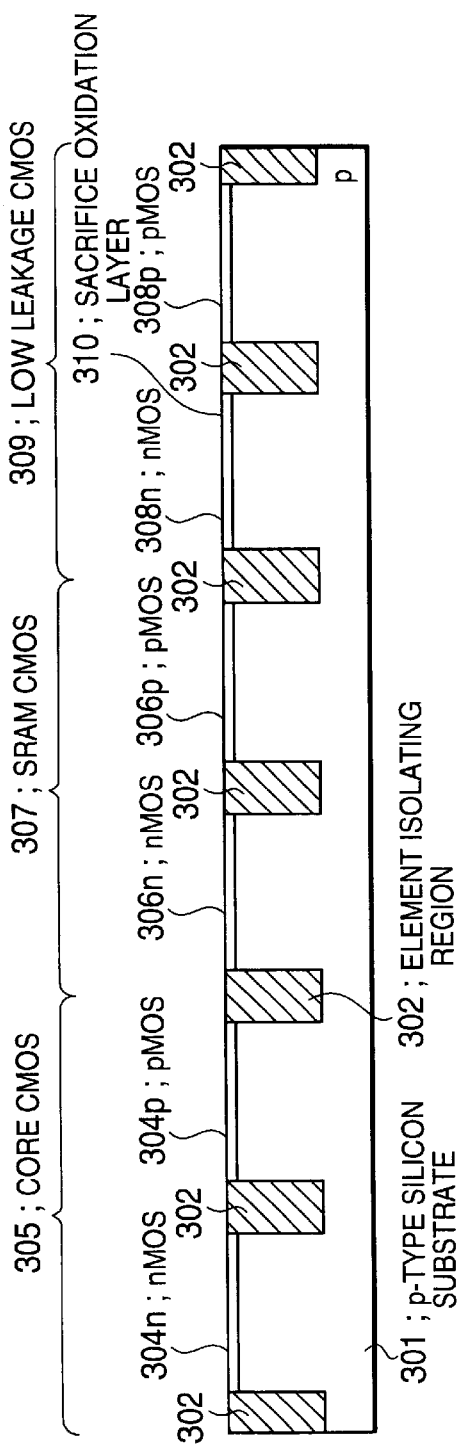
FIGS. 3A through 3K are process drawings for describing a manufacturing process of a semiconductor device according to a first embodiment of this invention.

At first, as shown in FIG. 3A, a p-type silicon substrate 301 having impurity density of $1 \times 10^{14}$–$5 \times 10^{15}$ cm$^{-3}$ is prepared and element isolating regions 302 with about 0.3 μm in depth are selectively formed in the substrate 301 by well known STI (Shallow Trench Isolation) technique.

Additionally, the element isolating regions 302 defines an n-type MOS transistor area 304n and a p-type MOS transistor area 304p of a core CMOS transistor area 305. Moreover, the element isolating regions 302 defines an n-type MOS transistor area 306n and a p-type MOS transistor area 306p of an SRAM CMOS transistor area 307. Furthermore the element isolating regions 302 defines an n-type MOS transistor area 308n and a p-type MOS transistor area 308p of a low leakage CMOS transistor area 309. Subsequently, sacrifice oxide films 310 are formed at the surface of each area of the substrate 301 by oxidizing the substrate 301.

Figure 3B:
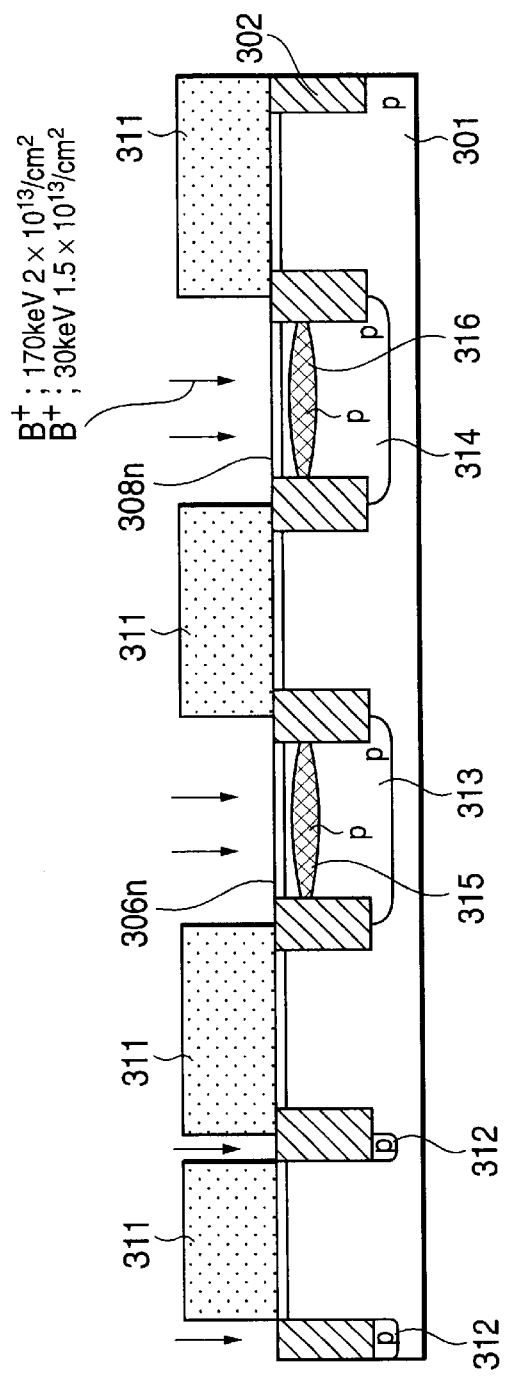

Next, a first resist film 311 is formed on a surface of the substrate 301 (or surfaces of both of the element isolating regions 302 and the sacrifice oxidation films 310) and selectively removed by first lithography process. As shown in FIG. 3B, the first resist film 311 is partially removed from the element isolation regions 302 of the n-type MOS transistor area 304n, the n-type MOS transistor area 306n, and the n-type MOS transistor area 308n by the first lithography. Then, by using the remaining first resist film 311 as a first mask for first ion implantation, p-type impurities of boron (B) are ion-implanted into the element isolation regions 302 of the n-type MOS transistor area 304n, the n-type MOS transistor area 306n, and the n-type MOS transistor area 308n on the condition of dose of about $2 \times 10^{13}$ cm$^{-2}$ and acceleration energy of about 170 KeV. Thus, p-type wells 312, 313, and 314 are formed and deeper than the element isolating regions 302.

Subsequently, by using the first mask for second ion implantation, the p-type impurities of boron (B) are ion-implanted into the element isolation regions 302 of the n-type MOS transistor area 304n, the n-type MOS transistor area 306n, and the n-type MOS transistor area 308n on the condition of dose of about $1.5 \times 10^{13}$ cm$^{-2}$ and acceleration energy of about 30 KeV. Thus, p-type threshold adjustment impurity regions 315 and 316 are formed in the p-type wells 313 and 314, respectively, as shown in FIG. 3B. Because the second ion implantation uses the same impurities as the first ion implantation uses and is carried out with lower acceleration energy than that in the first ion implantation, the p-type threshold adjustment impurity regions 315 and 316 are shallower than the p-type wells 313 and 314.

Figure 3C:
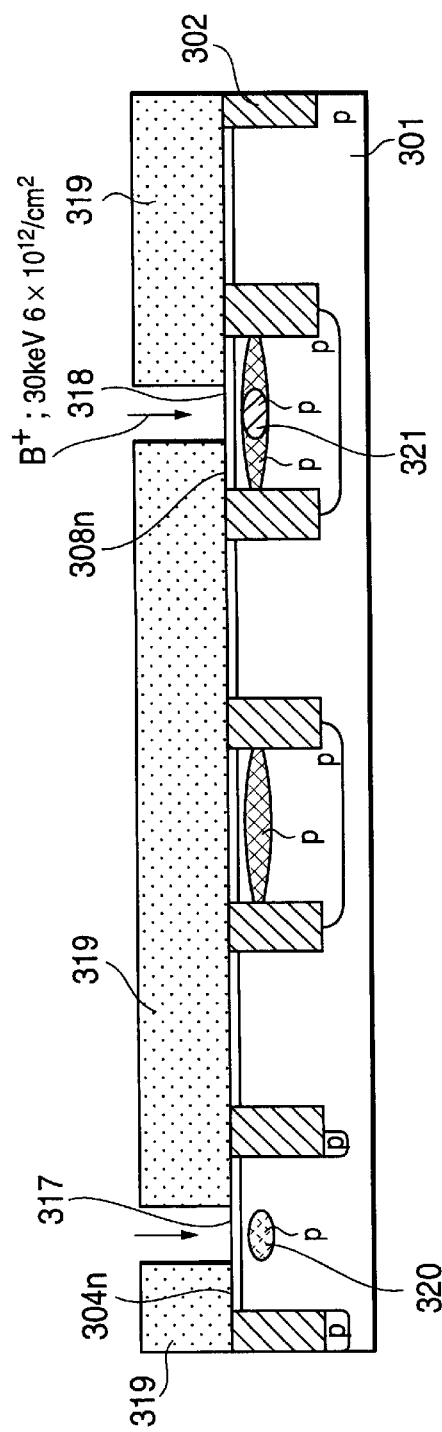

Next, a second resist film 319 is formed on the substrate 301 after the first resist film 311 is completely removed. As illustrated in FIG. 3C, the second resist film 319 is selectively removed from a gate section 317 of the n-type MOS transistor area 304n and a gate section 318 of the n-type MOS transistor area 308n by a second lithography process. Then, by using the remaining resist film 319 as a second mask for third ion implantation, the p-type impurities of boron (B) are ion-implanted into the gate sections 317 and 318 on the condition of dose of about $6 \times 10^{12}$ cm$^{-2}$ and acceleration energy of about 30 KeV. Thus, p-type threshold adjustment impurity regions 320 and 321 are formed at the gate sections 317 and 318. The p-type threshold adjustment impurity region 321 has the highest p-type impurity density in the state shown in FIG. 3C because the first and the second ion implantation are performed before the third ion implantation is performed.

Thus, the first through the third ion implantation are performed by the use of two resist films 311 and 319. That is, the lithography process is twice performed to form the p-type wells 312, 313 and 314, and the p-type threshold adjustment impurity regions 315, 316, 320 and 321 that are necessary to give three levels to thresholds of the n-type MOS transistors. Therefore, the n-type MOS transistors of this embodiment can be manufactured by less lithography processes than that for manufacturing the n-type MOS transistors of the conventional semiconductor device.

After that, n-type threshold adjustment impurity regions are formed in p-type MOS transistor area 304p, 306p and 308p as follows.

Figure 3D:
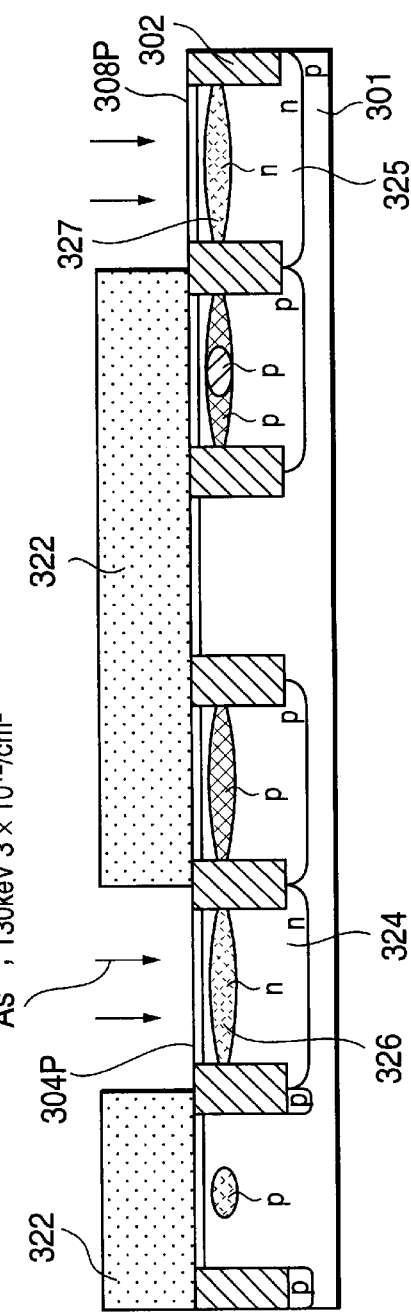

At first, a third resist film 322 is formed on the surface of the substrate 301 and selectively removed as shown in FIG. 3D after the second resist film 319 is completely removed. The third resist film 322 remains on the n-type MOS transistor areas 304n, 306n and 308n and the p-type MOS transistor areas 306p. Then, by using the remaining third resist film 322 as a third mask for forth ion implantation, the n-type impurities of phosphorus (P) are ion-implanted into the p-type MOS transistor areas 304p and 308p on the condition of dose of about $1\times10^{13}$ $cm^{-2}$ and acceleration energy of about 400 KeV. Thus, n-type wells 324 and 325 are formed in the substrate 301 at the p-type MOS transistor areas 304p and 308p, respectively.

Subsequently, by using the third mask for fifth ion implantation, the n-type impurities of arsenic (As) are ion-implanted into the p-type MOS transistor areas 304p and 308p on the condition of dose of about $3\times10^{12}$ $cm^{-2}$ and acceleration energy of about 130 KeV. Thus, n-type wells 326 and 327 are formed in the p-type wells 324 and 325, respectively.

Figure 3E:
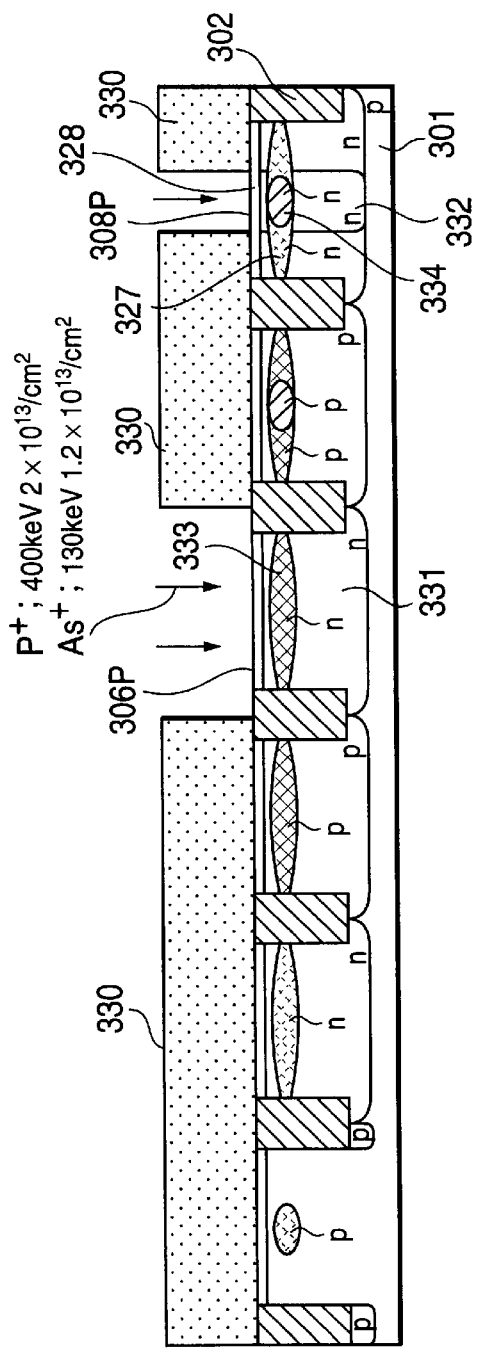

Next, a forth resist film 330 is formed on the surface of the substrate 301 and selectively removed as shown in FIG. 3E after the third resist film 322 is completely removed. The forth resist film 330 remains on the n-type MOS transistor areas 304n, 306n and 308n, the p-type MOS transistor area 304p, and the p-type MOS transistor area 308p except its gate section. Then, by using the remaining forth resist film 330 as a forth mask for sixth ion implantation, the n-type impurities of the phosphorus (P) are ion-implanted into the p-type MOS transistor areas 306p and the gate section of the p-type MOS transistor area 308p on the condition of dose of about $2\times10^{13}$ $cm^{-2}$ and acceleration energy of about 400 KeV. Thus, n-type wells 331 and 332 are formed in the substrate 301 at the p-type MOS transistor area 306p and the gate section of the p-type MOS transistor area 308p, respectively. Though the n-type well 332 is not necessarily necessary, it is formed when the n-type well 331 is formed in the p-type MOS transistor area 306p. This is inevitable to reduce the number of times of the lithography process and does not have harmful influence.

Subsequently, by using the fourth mask for seventh ion implantation, the n-type impurities of arsenic (As) are ion-implanted into the p-type MOS transistor area 306p and the gate section of the p-type MOS transistor area 308p on the condition of dose of about $1.2\times10^{13}$ $cm^{-2}$ and acceleration energy of about 130 KeV. Thus, n-type threshold adjustment region 333 is formed in the p-type well 331 while n-type threshold adjustment region 334 is formed in a region common to the p-type well 332 and the n-type threshold adjustment region 327.

The n-type threshold adjustment impurity region 334 has the highest n-type impurity density in the state shown in FIG. 3E because the forth, the fifth, and the sixth ion implantation are performed before the seventh ion implantation is performed.

Thus, the forth through the seventh ion implantation are performed by the use of two resist films 322 and 330. That is, the lithography process is twice performed to form the n-type wells 324, 325 and 331, and the n-type threshold adjustment impurity regions 326, 327, 333 and 334 that are necessary to give three levels to thresholds of the p-type MOS transistors. Therefore, the p-type MOS transistors of this embodiment can be manufactured by less lithography processes than that for manufacturing the p-type MOS transistors of the conventional semiconductor device.

Figure 3F:
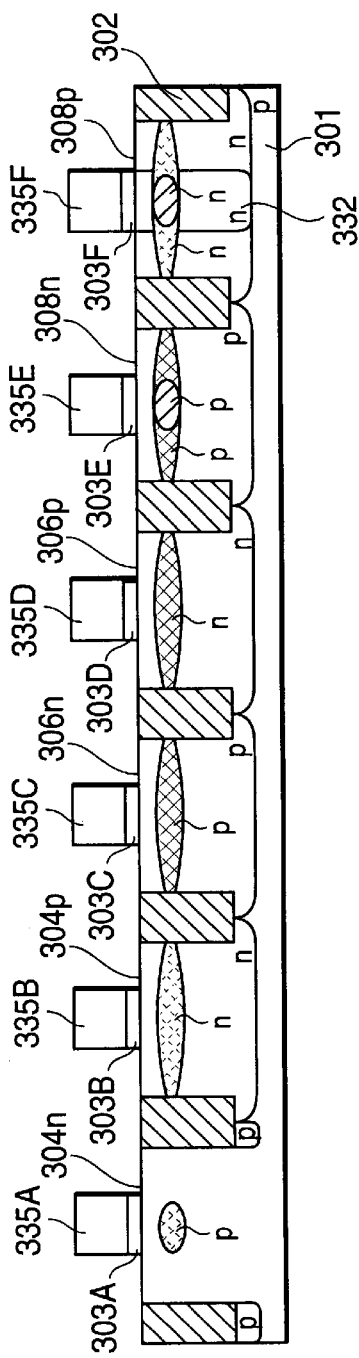

As illustrated in FIG. 3F, after the forth resist film is completely removed, the sacrifice oxide films 310 is removed. Then a gate oxide film 303 (303A–303F) having a thickness of 2.0–2.5 nm is formed by a heat oxidation method. A polycrystalline silicon film 335 having a thickness of about 150 nm is deposited on the gate oxide film 303 by a CVD (Chemical Vapor Deposition) method. The gate oxide film 303 and the polycrystalline silicon film 335 are selectively removed by a photolithography method to form stripes of about 100 nm in width. As a result, the gate oxide film 303 and the polycrystalline silicon film 335 turn into combinations of gate oxide films 303A–303F and gate electrodes 335A–335F. The combinations of gate oxide films 303A–303F and the gate electrodes 335A–335F correspond to the MOS transistor areas 304n, 304p, 306n, 306p, 308n and 308p, respectively.

Figure 3G:
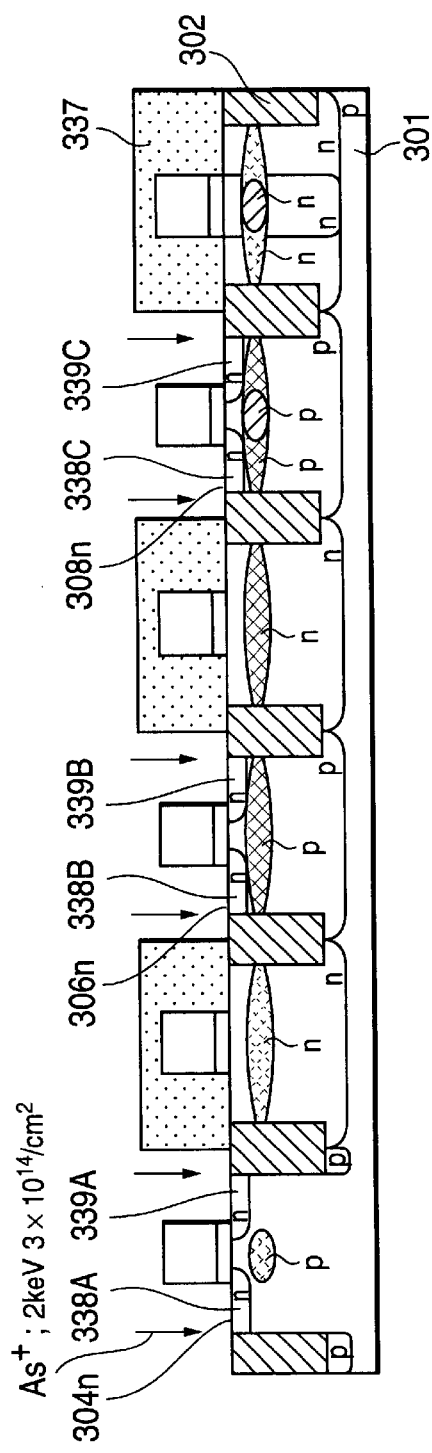

Next, as shown in FIG. 3G, fifth resist films 337 are formed on the p-type MOS transistor areas 304p, 306p and 308p so as to cover the gate oxide films 303B, 303D and 303F and the gate electrode 335B, 335D and 335F. Then, by using the fifth resist films 337 as a fifth mask for eighth ion implantation, the n-type impurities of the arsenic (As) are ion-implanted into the p-type MOS transistor areas 304p, 306p and 308p on the condition of dose of about $3\times10^{14}$ $cm^{-2}$ and acceleration energy of about 2 KeV. Thus, low impurity density n-type regions 338A–338C and 339A–339C, which are called extension regions, are formed in the p-type MOS transistor areas 304p, 306p and 308p. Each of the n-type regions 338A–338C becomes a part of an n-type source region while each of the n-type regions 339A–339C becomes a part of an n-type drain region.

Figure 3H:
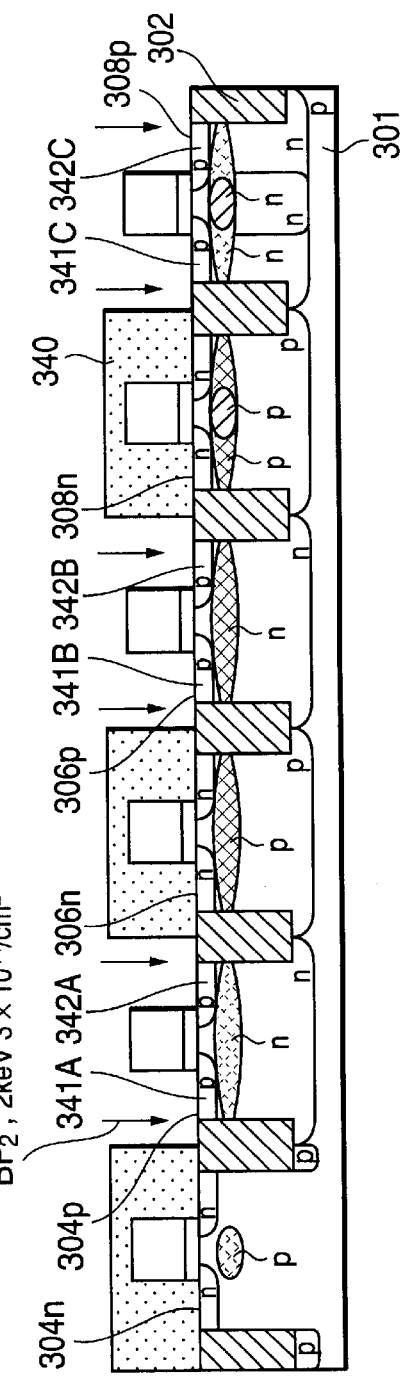
Figure 3I:
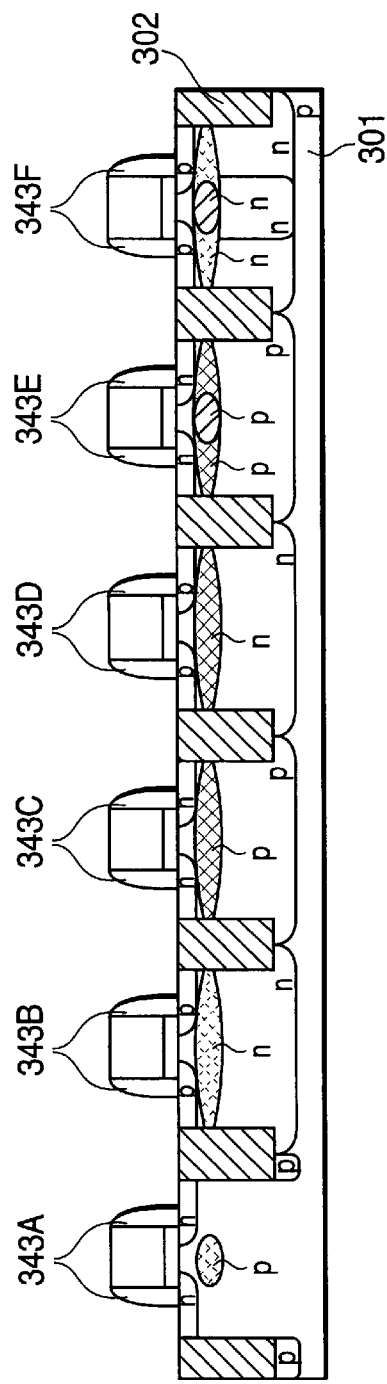

After the fifth resist films 337 are completely removed from the p-type MOS transistor areas 304p, 306p and 308p, sixth resist films 340 are formed on the n-type MOS transistor areas 304n, 306n and 308n so as to cover the gate oxide films 303A, 303C and 303E and the gate electrode 335A, 335C and 335E as shown in FIG. 3H. Then, by using the sixth resist films 340 as a sixth mask for ninth ion implantation, the p-type impurities of the boron fluoride ($BF_2$) are ion-implanted into the n-type MOS transistor areas 304n, 306n and 308n on the condition of dose of about $3\times10^{14}$ $cm^2$ and acceleration energy of about 2 KeV. Thus, low impurity density p-type regions 341A–341C and 342A–342C, which are called extension regions, are formed in the n-type MOS transistor areas 304n, 306n and 308n. Each of the p-type regions 341A–341C becomes a part of a p-type source region while each of the p-type regions 342A–342C becomes a part of a p-type drain region.

After the sixth resist films 340 are completely removed from the n-type MOS transistor areas 304n, 306n and 308n, a silicon oxide film having a thickness of 60 nm is deposited on an exposed surface by the CVD method. Subsequently, the silicon oxide film is selectively etched to remove unnecessary section of it and to form side wall insulation films 343A–343F.

Figure 3J:
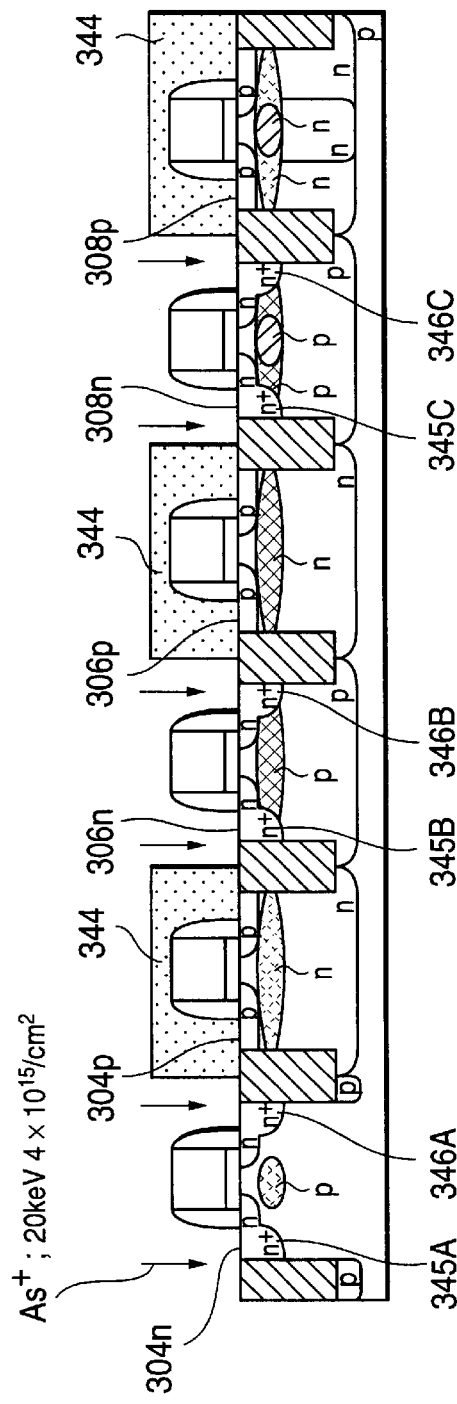

Next, as shown in FIG. 3J, seventh resist films 344 are formed on the p-type MOS transistor areas 304p, 306p and 308p so as to cover the gate oxide films 303B, 303D and 303F, the gate electrode 335B, 335D and 335F, and the side wall insulation films 343B, 343D and 343F. Then, by using the seventh resist films 344 as a seventh mask for tenth ion implantation, the n-type impurities of the arsenic (As) are ion-implanted into the p-type MOS transistor areas 304p, 306p and 308p on the condition of dose of about $4 \times 10^{15}$ cm$^{-2}$ and acceleration energy of about 20 KeV. Thus, high impurity density n$^+$-type regions 345A–345C and 346A–346C are formed in the p-type MOS transistor areas 304p, 306p and 308p. Each of the n$^+$-type regions 345A–345C becomes another part of the n-type source region while each of the n$^+$-type regions 345A–345C becomes another part of the n-type drain region.

Figure 3K:
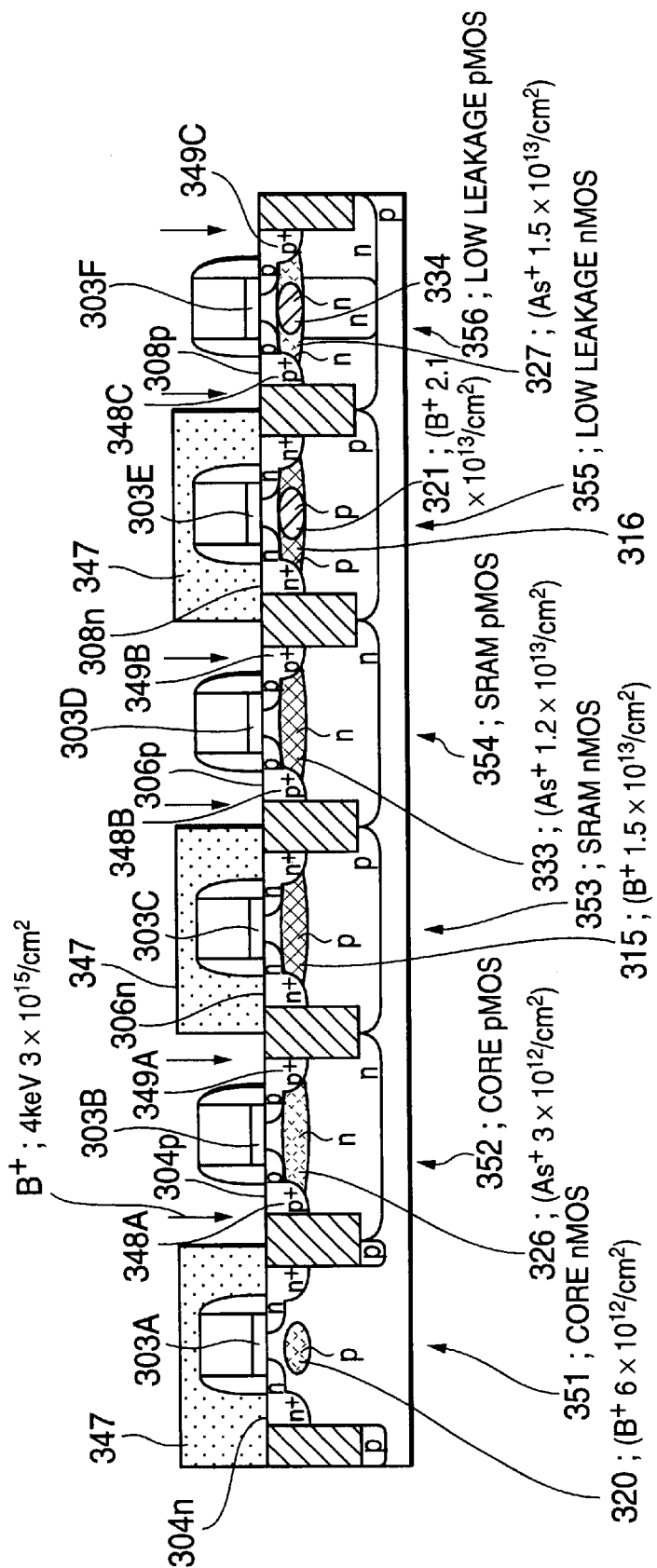

After the seventh resist films 344 are completely removed from the p-type MOS transistor areas 304p, 306p and 308p, eighth resist films 347 are formed on the n-type MOS transistor areas 304n, 306n and 308n so as to cover the gate oxide films 303A, 303C and 303E, and the gate electrode 335A, 335C and 335E, and the side wall insulation films 343A, 343C and 343D as shown in FIG. 3K. Then, by using the eighth resist films 347 as a eighth mask for eleventh ion implantation, the p-type impurities of the boron (B) are ion-implanted into the n-type MOS transistor areas 304n, 306n and 308n on the condition of dose of about $3 \times 10^{15}$ cm$^{-2}$ and acceleration energy of about 4 KeV. Thus, high impurity density p$^+$-type regions 348A–348C and 349A–349C are formed in the n-type MOS transistor areas 304n, 306n and 308n. Each of the p$^+$-type regions 348A–348C becomes another part of the p-type source region while each of the p-type regions 349A–349C becomes another part of the p-type drain region.

After the eighth resist films 347 are completely removed from the n-type MOS transistor areas 304n, 306n and 308n, annealing is performed to activate the n-type source and drain regions and the p-type source and the drain regions.

Thus, a core n-type MOS transistor 351 is completed in the n-type MOS transistor area 304n of the core CMOS transistor areas 305. Similarly, a core p-type MOS transistor 352 is completed in the p-type MOS transistor area 304p of the core CMOS areas 305. A SRAM n-type MOS transistor 353 is completed in the n-type MOS transistor area 306n of the SRAM CMOS transistor areas 307. A SRAM p-type MOS transistor 354 is completed in the p-type MOS transistor area 306p of the SRAM CMOS transistor areas 307. A low leakage n-type MOS transistor 355 is completed in the n-type MOS transistor area 308n of the low leakage CMOS transistor areas 309. A low leakage p-type MOS transistor 356 is completed in the p-type MOS transistor area 308p of the low leakage CMOS transistor areas 309.

In the core n-type MOS transistor 351, the source region composed of the low impurity density n-type region 338A and the high impurity density n$^+$-type region 345A while the drain region composed of the low impurity density p-type region 339A and the high impurity density p$^+$-type region 346A. Each structure of the source region and the drain region of the core n-type MOS transistor 351 is called an LDD (Lightly Doped Drain) structure. Each of the source regions and the drain regions of the other transistors 352–356 is also called the LDD structure.

The n-type core transistor 351 has the p-type threshold adjustment impurity region 320 formed by using the p-type impurities of the dose of $6 \times 10^{12}$ cm$^{-2}$ under the gate insulation film 303A. The p-type core transistor 352 has the n-type threshold adjustment impurity region 326 formed by using the n-type impurities of the dose of $3 \times 10^{12}$ cm$^{-2}$ under the gate insulation film 303B. The n-type and the p-type core transistors 351 and 352 form a core CMOS transistor having a low threshold.

The n-type SRAM transistor 353 has the p-type threshold adjustment impurity region 315 formed by using the p-type impurities of the dose of $1.5 \times 10^{13}$ cm$^{-2}$ under the gate insulation film 303C. The p-type SRAM transistor 354 has the n-type threshold adjustment impurity region 333 formed by using the n-type impurities of the dose of $1.2 \times 10^{13}$ cm$^{-2}$ under the gate insulation film 303D. The n-type and the p-type SRAM transistors 353 and 354 form a SRAM CMOS transistor having a middle threshold.

The n-type low leakage transistor 355 has the p-type threshold adjustment impurity region 321 (and 316) formed by using the p-type impurities of the dose of $2.1 \times 10^{13}$ cm$^{-2}$ under the gate insulation film 303E. The p-type low leakage transistor 356 has the n-type threshold adjustment impurity region 334 (and 327) formed by using the n-type impurities of the dose of $1.5 \times 10^{13}$ cm$^{-2}$ under the gate insulation film 303F. The n-type and the p-type low leakage transistors 353 and 354 form a low leakage CMOS transistor having high thresholds.

In the n-type core transistor 351, both of the source and the drain regions are apart from the high impurity density region 320. In other words, the source region (i.e. n-type region 338A and n$^+$-type region 345A) and the drain region (i.e. n-type region 339A and n$^+$-type region 346A) are in contact with the substrate having low impurity density. Accordingly, depletion layers between each of the source and the drain regions widen when the n-type core transistor 351 is in the on state. Therefore, junction capacitance Cj between each of the source and the drain regions and the substrate 301 can be reduced in comparison with that of the conventional semiconductor device.

On the other hand, the source region (in particular, p$^+$-type region 348A) and the drain region (in particular, p$^+$-type region 349A) of the p-type core transistor 352 are in contact with the n-type well 324. Because the n-type well 324 has lower impurity density then that of the conventional semiconductor device, junction capacitance between each of the source and the drain regions and the n-type well 324 can be reduced in comparison with that of the conventional semiconductor device.

In addition, the p-type impurity density adjustment region 316 formed under the source region (i.e. n-type region 338C and n$^+$-type region 345C) and the drain region (i.e. n-type region 339C and n$^+$-type region 346C) of the n-type low leakage transistor 355 has lower p-type impurity density than that of the conventional semiconductor device. This is because the p-type impurity density adjustment region 316 is formed by using the impurities of the dose of $1.5 \times 10^{13}$ cm$^{-2}$ while that of the conventional semiconductor device is formed by using the impurities of the dose of $2.1 \times 10^{13}$ cm$^{-2}$. Therefore, junction capacitance Cj between each of the source and the drain regions and the substrate 301 can be reduced in comparison with that of the conventional semiconductor device. This means that a standby or waiting circuit including the n-type low leakage transistor 355 can operates more rapidly than that included in the conventional semiconductor device.

Figure 4C:
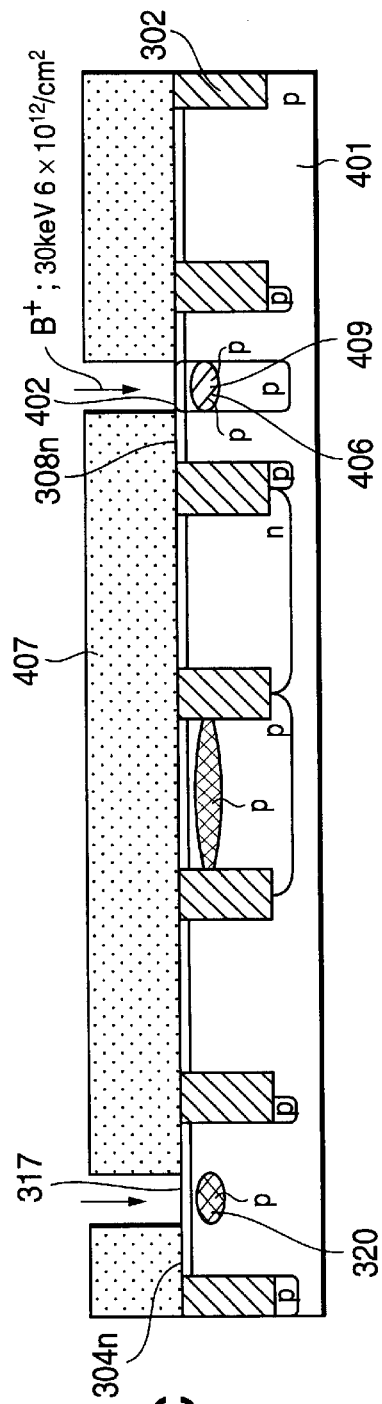

Referring to FIGS. 4A through 4D, the description will be made about a method of manufacturing a semiconductor device according to a second embodiment of this invention. Additionally, difference between the second embodiment and the first embodiment is that ion implantation for the n-type MOS transistor area 308n is performed on element isolation regions and gate region as shown in FIG. 4B.

At first, a semiconductor substrate 401 is prepared as shown in FIG. 4A. The semiconductor substrate 401 is equal to the substrate 301 of FIG. 3A.

Next, a primary resist film 403 is formed on the substrate 401 and selectively removed from the element isolation regions 302 of the n-type MOS transistor areas 304n and 308n, the n-type MOS transistor area 306n, and the gate section 402 of the n-type MOS transistor area 308n as shown in FIG. 4B. Then, by using the remaining primary resist film 402 as a primary mask for primary ion implantation, p-type impurities of boron (B) are ion-implanted on the condition of dose of about $2\times10^{13}$ cm$^{-2}$ and acceleration energy of about 170 KeV. Thus, p-type wells 312, 313, 404 and 405 are formed and deeper than the element isolating regions 302.

Subsequently, by using the primary mask for secondary ion implantation, the p-type impurities of boron (B) are ion-implanted on the condition of dose of about $1.5\times10^{13}$ cm$^{-2}$ and acceleration energy of about 30 KeV. Thus, p-type threshold adjustment impurity regions 315 and 406 are formed in the p-type wells 313 and 405, respectively, as shown in FIG. 4B. Because the secondary ion implantation uses the same impurities as the primary ion implantation uses and is carried out with lower acceleration energy than that in the first ion implantation, the p-type threshold adjustment impurity regions 315 and 406 are shallower than the p-type wells 313 and 405.

Next, a secondary resist film 407 is formed on the substrate 401 after the primary resist film 403 is completely removed. As illustrated in FIG. 4C, the secondary resist film 407 is selectively removed from a gate section 317 of the n-type MOS transistor area 304n and the gate section 402 of the n-type MOS transistor area 308n. Then, by using the remaining resist film 407 as a secondary mask for thirdly ion implantation, the p-type impurities of boron (B) are ion-implanted into the gate sections 317 and 402 on the condition of dose of about $6\times10^{12}$ cm$^{-2}$ and acceleration energy of about 30 KeV. Thus, p-type threshold adjustment impurity regions 320 and 409 are formed in the gate sections 317 and 402. The p-type threshold adjustment impurity region 409 has the highest p-type impurity density in the state shown in FIG. 4C because the primary and the secondary ion implantation are performed before the thirdly ion implantation is performed.

Thus, the primary through the thirdly ion implantation are performed by the use of two resist films 403 and 407. That is, the lithography process is twice carried out to form the p-type wells 312, 313, 404 and 405, and the p-type threshold adjustment impurity regions 315, 406, 320 and 409 that are necessary to give three levels to thresholds of the n-type MOS transistors. Therefore, the n-type MOS transistors of this embodiment can be manufactured by less lithography processes than that for manufacturing the n-type MOS transistors of the conventional semiconductor device.

Figure 4D:
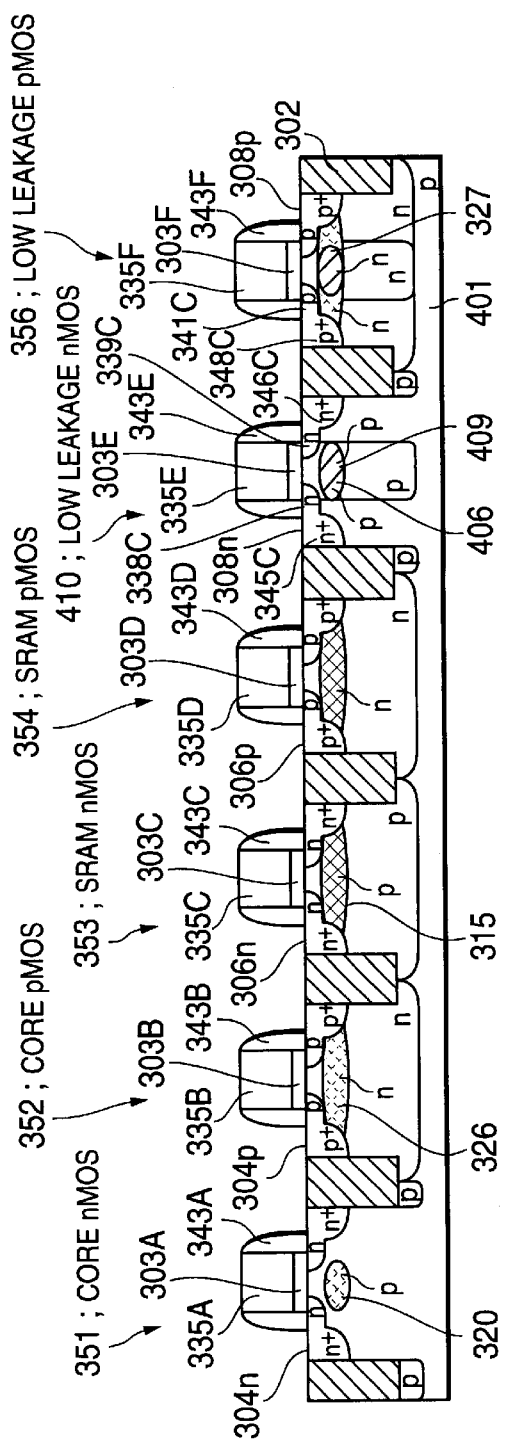

After that, as shown in FIG. 4D, three n-type MOS transistors 351, 353 and 410 and three p-type MOS transistors 352, 354 and 356 are formed like the first embodiment.

In the n-type low leakage transistor 410, both of the source and the drain regions are apart from the p-type threshold adjustment impurity regions 409. In other words, the source region (n-type region 338C and n$^+$-type region 345C) and the drain region (n-type region 339C and n$^+$-type region 346C) are in contact with the substrate 401 having low impurity density. Accordingly, the junction capacitance Cj between each of the source and the drain regions and the substrate can be lower than that of the first embodiment because depletion layers are expanded when the n-type low leakage transistor 410 is in on state.

While this invention has thus for been described in conjunction with the preferred embodiment thereof, it will readily be possible for those skilled in the art to put this invention into practice in various other manners. For example, the structure of each of the drain regions and the source regions may adopt various structures except for the LDD structure.

Moreover, the conditions of the ion implantation (e.g. the dose, the acceleration energy), the kind of the impurity, the thickness of the insulation film may change according to objects and use.

Furthermore, the gate insulating film may be a nitride film or a combination of an oxide film and the nitride film. That is, the MIS transistor may be an MNS (Metal Nitride Semiconductor) transistor or an MNOS (Metal Nitride Oxide Semiconductor) transistor.

In addition, conductive types (p-type and n-type) may be exchange between each other.

What is claimed is:

1. A method of manufacturing semiconductor device having first, second and third MIS transistors on a semiconductor substrate, said first MIS transistor having a first threshold, said second MIS transistor having a second threshold higher than said first threshold, said third MIS transistor having a third threshold higher than said second threshold, said method comprising the steps of:

depositing a first mask on said semiconductor substrate at a first area for said first MIS transistor;

introducing first impurities into said semiconductor substrate to form wells at second and third areas for said second and said third MIS transistors;

successively, introducing second impurities into said wells to form first threshold adjustment regions for said second threshold;

depositing a second mask on said semiconductor substrate at said second area for said second MIS transistor after removing the first mask; and introducing third impurities into said semiconductor substrate to form second threshold adjustment regions for said first threshold at said first and said third areas, one of said second threshold adjustment regions serving as a third threshold adjustment region for said third threshold together with one of said first threshold adjustment regions at said third area.

2. A method of manufacturing semiconductor device having first, second and third MIS transistors in a semiconductor substrate, said first MIS transistor having a first threshold, said second MIS transistor having a second threshold higher than said first threshold, said third MIS transistor having a third threshold higher than said second threshold, said method comprising the steps of:

defining first, second and third areas corresponding to said first, said second and said third MIS transistors, respectively, on a surface of said semiconductor substrate;

depositing a first mask having first and second opening windows corresponding to said second and said third areas, respectively, on said surface of said semiconductor substrate;

introducing first impurities into said semiconductor substrate through said first and said second opening windows to form wells at said second and said third areas at the same time;

successively introducing second impurities into said wells through said first and said second opening windows to form first threshold adjustment regions for said second threshold at the same time;

completely removing said first mask from said surface of said semiconductor substrate;

depositing a second mask having third and fourth opening windows corresponding to said first and said third areas, respectively, on said surface of said semiconductor substrate; and introducing third impurities into said semiconductor substrate through said third and said fourth opening windows to form second threshold adjustment regions for said first threshold at the same time, one of said second threshold adjustment regions serving as a third threshold adjustment region for said third threshold together with one of said first threshold adjustment regions at said third area.

3. A method as claimed in claim 2, wherein said third and said fourth opening windows are smaller than said first and said third areas, respectively.

4. A method as claimed in claim 3, wherein said third and said fourth opening windows correspond to gate areas of said first and said third MIS transistors, respectively.

5. A method as claimed in claim 3, wherein said second opening window has the same size as that of said fourth opening windows.

6. A method as claimed in claim 2, wherein each of the introducing steps is carried out by ion implantation.

7. A method as claimed in claim 2, wherein said MIS transistors are MOS transistors.

8. A method as claimed in claim 7, wherein each of said MOS transistors is one of MOS transistors forming a CMOS transistor.

9. A method of manufacturing semiconductor device having first, second and third MOS transistors having a first conductive type and fourth, fifth and sixth MOS transistors having a second conductive type different from said first conductive type, said first and said forth MOS transistors forming a first CMOS transistor having a first threshold, said second and said fifth MOS transistors forming a second CMOS transistor having a second threshold higher than said first threshold, said third and said sixes MOS transistors forming a third CMOS transistor having a third threshold higher than said second threshold, said method comprising the steps of:

defining first through sixth areas corresponding to first through sixth MOS transistors, respectively, on a surface of said semiconductor substrate;

depositing a first mask having first and second opening windows corresponding to said second and said third areas, respectively, on said surface of said semiconductor substrate;

introducing first impurities of the second conductive type into said semiconductor substrate through said first and said second opening windows to form first wells in said second and said third areas at the same time;

successively introducing second impurities of the second conductive type into said first wells through said first and said second opening windows to form first threshold adjustment regions for said second threshold at the same time;

completely removing said first mask from said surface of said semiconductor substrate;

depositing a second mask having third and fourth opening windows corresponding to said first and said third areas, respectively, on said surface of said semiconductor substrate;

introducing third impurities of the second conductive type into said semiconductor substrate through said third and said fourth opening windows to form second threshold adjustment regions for said third threshold at the same time, one of said second threshold adjustment regions serving as a third threshold adjustment region for said third threshold together with one of said first threshold adjustment regions at third area, completely removing said second mask from said surface of said semiconductor substrate;

depositing a third mask having fifth and sixth opening windows corresponding to said fourth and said sixth areas, respectively, on said surface of said semiconductor substrate;

introducing fourth impurities of the first conductive type into said semiconductor substrate through said fifth and said sixth opening windows to form second wells in said fourth and said sixth areas at the same time;

successively introducing fifth impurities of the first conductive type into said second wells through said fifth and said sixth opening windows to form fourth threshold adjustment regions for said first threshold at the same time;

completely removing said third mask from said surface of said semiconductor substrate;

depositing a fourth mask having seventh and eighth opening windows corresponding to said fifth and said sixth areas, respectively, on said surface of said semiconductor substrate;

introducing sixth impurities of the first conductive type into said semiconductor substrate through said seventh and said eighth opening windows to form third wells in said fifth and said sixth areas at the same time; and successively introducing seventh impurities of the first conductive type into said semiconductor substrate through said seventh and said eighth opening windows to form fifth threshold adjustment regions for said second threshold in said third wells at the same time, one of said fifth threshold adjustment regions serving as a sixth threshold adjustment region for said third threshold together with one of said fourth threshold adjustment regions at sixth area.

10. A method as claimed in claim 9, wherein said third and said fourth opening windows are smaller than said first and said third areas, respectively.

11. A method as claimed in claim 10, wherein said third and said fourth opening windows correspond to gate areas of said first and said third MOS transistors, respectively.

12. A method as claimed in claim 10, wherein said second opening window has the same size as that of said fourth opening windows.

13. A method as claimed in claim 9, wherein said eighth opening window is smaller than said sixth area.

14. A method as claimed in claim 13, wherein said eighth opening window corresponds to a gate area of said sixth MOS transistors.

15. A method as claimed in claim 9, wherein each of the introducing steps is carried out by ion implantation.

16. A method as claimed in claim 1, wherein said first MIS transistor comprises a core transistor, said second MIS transistor comprises a static random access memory transistor, and said third MIS transistor comprises a low leakage transistor.

17. A method as claimed in claim 2, wherein said first MIS transistor comprises a core transistor, said second MIS transistor comprises a static random access memory transistor, and said third MIS transistor comprises a low leakage transistor.

18. A method as claimed in claim 1, wherein a lithography process is twice performed to form the first, second, and third threshold regions having the first, second, and third thresholds, respectively.

19. A method as claimed in claim 1, wherein a lithography process is twice performed to form the first, second, and third threshold regions having the first, second, and third thresholds, respectively.

* * * * *